United States Patent [19]

Gamble

[11] Patent Number: 5,097,202
[45] Date of Patent: Mar. 17, 1992

[54] FAULTED CURRENT INDICATORS WITH IMPROVED SIGNAL TO NOISE RATIOS

[75] Inventor: John G. Gamble, Hull, Mass.

[73] Assignee: Sigma Instruments, Inc., Weymouth, Mass.

[21] Appl. No.: 361,903

[22] Filed: Jun. 5, 1989

[51] Int. Cl.⁵ .......................... G01R 1/20; H01F 27/24
[52] U.S. Cl. .................................. 324/127; 324/117 R; 336/175; 336/212
[58] Field of Search .................... 324/127, 117 R, 126, 324/537, 538, 543; 336/212, 175, 176

[56] References Cited

U.S. PATENT DOCUMENTS

| | | | |
|---|---|---|---|
| 1,832,290 | 11/1931 | Fischer | 336/212 |
| 1,952,072 | 3/1934 | Jewell | 336/212 |
| 3,812,428 | 5/1974 | Trenkler | 324/127 |
| 3,816,816 | 6/1974 | Schweitzer, Jr. | 324/133 |
| 4,298,838 | 11/1981 | Akamatsu et al. | 324/127 |
| 4,480,477 | 11/1984 | Huschelrath et al. | 336/212 |
| 4,721,840 | 1/1988 | Fielding | 324/117 H |
| 4,791,361 | 12/1988 | Biehoff et al. | 324/126 |
| 4,845,454 | 7/1989 | Watanabe et al. | 324/212 |
| 4,939,449 | 7/1990 | Cattaneo et al. | 324/117 R |
| 4,947,108 | 8/1990 | Gudel | 324/117 H |

Primary Examiner—Ernest F. Karlsen
Attorney, Agent, or Firm—Stanger, Michaelson, Spivak & Wallace

[57] ABSTRACT

In a sensor for sensing current in a conductor, a magnetic laminar arrangement adapted to surround the conductor passes through a coil. Inside the coil the laminar arrangement forms a gap with two projections extending transverse to lamina within the arrangement and facing each other. In one embodiment the coil drives a display to form part of a fault indicator.

28 Claims, 2 Drawing Sheets

FAULTED CURRENT INDICATORS WITH IMPROVED SIGNAL TO NOISE RATIOS

BACKGROUND OF THE INVENTION

This invention relates to low noise faulted current indicators, and particularly to methods and means for indicating the existence and locations of faults in such systems.

Faulted current indicators (or FCI's or fault indicators) are placed at intervals along power lines or cables to decrease the time of locating faults, either temporary or permanent, on utility distribution systems. In general, each FCI is a high current trip and low current reset indicating device that displays whether a fault has occurred between the indicator and a load. Such devices often respond unintentionally to noise in neighboring power lines or cables and may therefore provide inaccurate information.

As long as a fault indicator detects only the currents in the monitored line, it displays a fault predictably and resets reliably. However, extraneous magnetic fields affect the fault indicator, especially where the line it monitors is near other electrical lines; as for example when the line that the fault indicator monitors is one phase conductor of a three phase line in the close vicinity of another phase conductor. The currents through the other phase conductors generate their own magnetic fields which induce noise signals in the fault indicators. Such noise is usually not sufficient to trip the fault indicator while it is sensing current in its phase conductor. However, the noise may reach values of sufficient amplitude to reset a tripped fault indicator when no current flows in the line. The would then fail to announce a fault, and line crews would find it more difficult to locate the fault and repair it. Since most indicators exhibit this susceptibility, a substantial portion of the indicators in a faulty line may become reset and ineffective.

OBJECTS AND SUMMARY OF THE INVENTION

An object of this invention is to overcome these deficiencies.

Another object of this invention is to make faulted current indicators less susceptible to the flux fields emanating from high currents flowing in adjacent conductors.

According to a feature of the invention, these objects are attained in whole or in part by coupling the sensing coil to the line being monitored, with a magnetic circuit that surrounds the line and passes through the coil and exhibits a high permeability in the area outside the coil and a lower permeability inside the coil.

According to another feature of the invention, the region of lower permeability within the coil is in the form of a central air gap.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
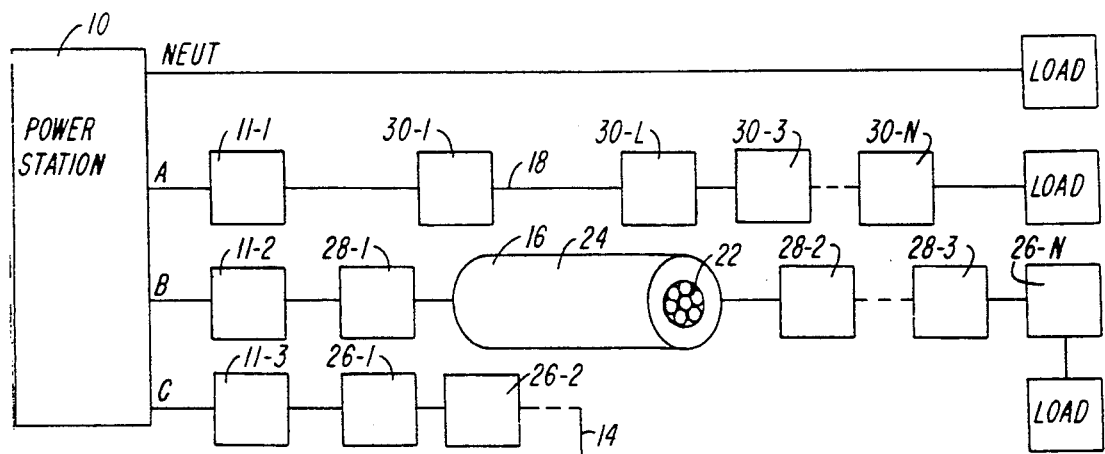
FIG. 1 is a partially schematic diagram illustrating a power distribution system embodying features of the invention and including a sectional view of a fault indicator sensor embodying features of the invention.
Figure 1:
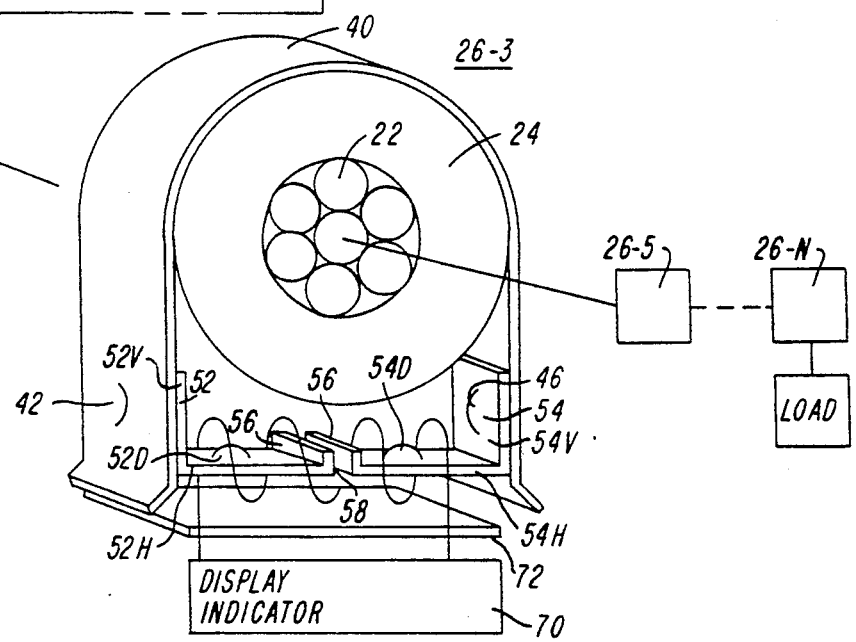

In FIG. 1, a power source 10 distributes energy serial through circuit breakers or fuses 11-1, 11-2, and 11-3 to various locations along a three-phase power distribution line 12 having three or four parallel phase conductors depending upon whether the system utilizes a three-wire delta or four-wire wye configuration. For simplicity FIG. 1 illustrates use of a three-phase four-wye configuration with three phase conductors or cables 14, 16, and 18 and a neutral conductor 20. Underground phase cconductors are shown. Each underground phase conductor or cable includes conductive center wires 22 and a surrounding insulator 24. Overhead conductors are susually not insulated. At spaced locations along phase cable 14, successive fault indicators 26-1, 26-2, 26-3, 26-4 . . . 26-N sense the current in that cable; spaced fault indicators 28-1, 28-3 . . . 28-N detect current in the cable 16; and fault indicators 30-1 to 30-N in cable 18. Each fault indicator 26-1 to 26-N, 28-1 to 28-N, 30-1 to 30-N produces and maintains a visual fault display whenever a fault or short circuit occurs in its line at a location more remote from the power source than the fault indicator. For example, in the phase conductor 14, if a fault occurs between the third fault indicator 26-3 and the fourth fault indicator 26-4, the excessive current will trip the first, second and third fault indicators 26-1, 26-2, and 26-3 into a fault fdisplaying condition. Since the fault indicators 26-4 to 26-N do not see any fault current their displays will remain in the normal (reset) position. Thus the overall condition of the fault indicators 26-1 to 26-N reveals a fault between the last indicator 26-3 having a fault display and the first indicator 26-4 having a normal display.

Figure 2:
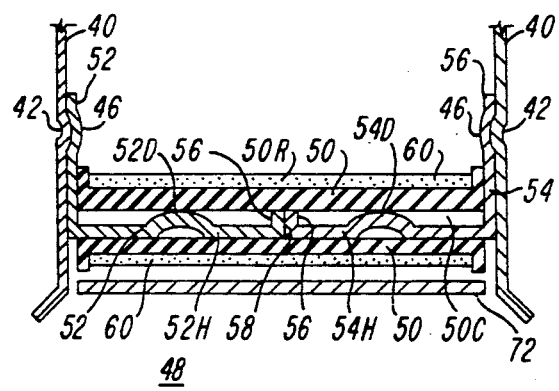
FIG. 2 is a diagram illustrating details of the fault indicator in FIG. 1.

FIG. 1 illustrates the third fault indicator 26-3 in the cable 14 of the three-phase wye configured line 12. The remaining fault indicators 26-1 to 30-N in all cables 14 to 18 are identical to the third fault indicator 26-3 along the cable 14. At the third indicator 26-3, a U-shaped lamination (or bow) 40 of magnetic material partially surrounds the cable 14. A 0.003" layer of paint covers the lamination 40 to protect it from corrosion. As shown in FIG. 2, the ends of the lamination 40 have dimples 42. These engage and hold the dimples 46 of a coil assembly 48, which a rigid non-magnetic mounting arrangement (not shown) maintains in a substantially rigid configuration.

As shown in FIGS. 1 and 2, the coil assembly includes a flanged rectangular bobbin 50, and two L-shaped structures 52 and 54 whose horizontal legs 52H and 54H are press fitted into the rectangular opening 50C of the bobbin 50 by means of two upstanding walls 56 and two dimples 52D and 54D. The vertical legs 52V and 54V of the structures 52 and 54 engage the lamination 40 at the dimples 42 with the dimples 46. In effect the assembly 48 clips into the lamination with the dimples 46. A 0.003" layer of paint (not shown) also covers the structures 52 and 54. The latter contact each other across the paint (not shown) on the interfacing walls. The two layers of paint on the two members 52 and 54 separate the ferromagnetic material on the structures 52 and 54 to form a magnetic gap 58. The paint has a reluctance substantially equal to that of air. Thus the magnetic gap 58 forms an effective air gap which FIG. 1 illustrates schematically. The gap is not shown in FIG. 2.

The coil assembly 48 also includes a coil 60 wound on the bobbin 50 so as to surround the gap 58, the walls or pose faces 56, and the horizontally inwardly extending members 52H and 54H of the structures 52 and 54. The coil 60 winds about the horizontal legs 52H and 54H, the pole faces 56 and the gap 58 in the same direction throughout its length. The coil 60 connects to an electromagnetic display 70 in the indicator 26-3. According to one embodiment of the invention, the display 70 is electronically controlled. The display shifts or "sets" to a fault condition when a short circuit produces a current that activates the indicator 26-3, and remains in the fault condition even after the short circuit ceases in response to operation of the circuit breaker 11-4.

The aforementioned assembly 48 supports a plate 72 of high-mu material, for example, 80% Ni—Fe, or of cold rolled steel outside of the coil 60 to form a magnetic screen. All the fault indicators 26-1 to 30-N are identical to the fault indicator 26-3.

After repair of the fault and resetting of the circuit breaker 11-4, normal current flows again through the line 14. The display 70 now automatically resets to the no-fault condition.

In operation, current flows through all the cables 14 to 18 if they are connected to loads L and no fault exists. The current through the fault indicators 26-1 to 30-N produces an alternating magnetic field whose flux lines pass serially through the yoke, composed of the lamination 40 and the structures 52 and 54, in alternating clockwise and counter-clockwise directions. The flux in the lamination 40 and structures 52 and 54 alternates typically at 50 Hz or 60 Hz. This alternating flux through the coil 60 induces a current in the coil which actuates the display 70. For normal operating phase currents in the cables 14 to 18, the currents induced in the coil 60 cause the display 70 to exhibit a no-fault condition. However, a current surge through a line such as 14 causes the surrounding magnetic flux field to induce a current sufficient to exceed the threshold value beyond which the display 70 exhibits a fault condition. When the circuit breaker 11-4 trips, current through the phase line 14 ends and the indicator remains in its fault condition.

Figure 3:
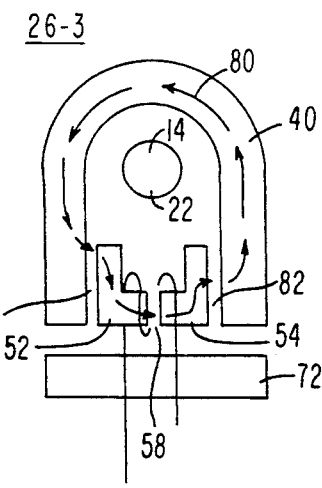
FIG. 3 is a schematic diagram illustrating the signal flux flow within the sensor of the fault indicator of FIG 1.

FIG. 3 illustrates the fluxes generated by the phase conductor 14 in the lamination 40 and structures 52 and 54 whose thicknesses here appear exaggerated in order to provide room for illustration of the flux lines 80. Also exaggerated are the gaps 58 as well the gaps 82 formed between the dimples 42 and 46. The main flux or "signal" flux lines 80 pass through the lamination 40, the gaps 82 and 58 as well as the structures 52 and 54. The closeness of the phase conductor 14 to the lamination 40 causes the currents through the phase conductor to generate high-flux fields which the gaps 82 and 58 attenuate only slightly.

Figure 4:
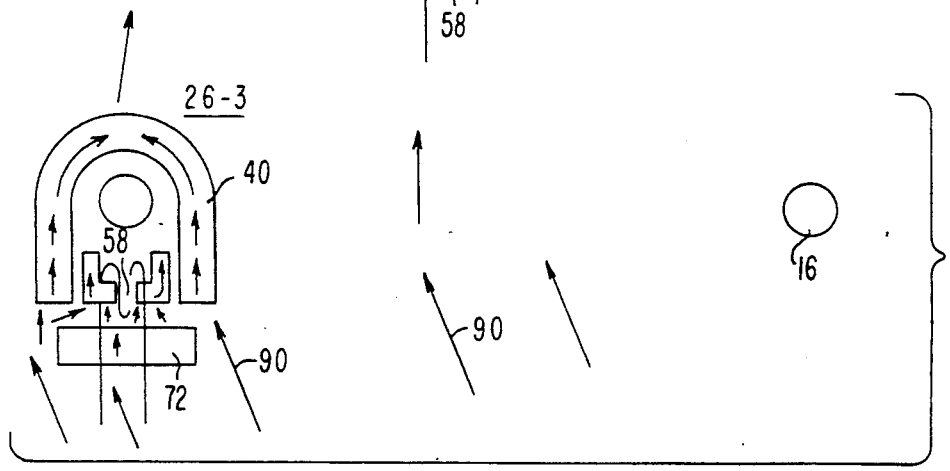
FIGS. 4 and 5 are explanatory diagrams illustrating the effects of fluxes which neighboring current carrying conductors induce in the indicator of FIG. 1.

FIG. 4 shows the effects of flux lines 90 from a neighboring phase conductor 16 upon the fault indicator 26-3. In FIG. 4, the flux lines pass substantially vertically relative to indicator 26-3. The flux lines 90 substantially divide at the gap 58 into two opposing flux fields that cancel each other as they pass through the lamination 40. Thus, with or without the plate 72, fluxes passing vertically with respect to the indicator 26-3 cancel each other by virtue of their division at the gap 58. Thus the coil 60 senses substantially no flux from the phase conductor 16.

Any additional flux resulting from adjacent phase conductor 16 during normal current flow through the phase conductor 14 has little effect upon the operation of the indicator 26-3. This arises because the amount of noise current induced by the fairly distant phase conductor 16 is minute compared to the signal current. On the other hand, when the surge through the phase conductor 14 causes indicator 26-3 to display a fault condition, the circuit breaker 11-4 stops the flow of current through the conductor 14. At this point, the only fluxes which the coil 60 senses are those generated by the adjacent phase conductor 16. This creates the danger of currents in adjacent phase conductor 16 producing fluxes that induce sensing currents in the coil 60 sufficient to reset the display to the no-fault condition. The present invention avoids such false reset by splitting fluxes approaching the indicator 26-3 vertically into two opposing paths that cancel each other within the coil 60 as shown in FIG. 4.

Figure 5:
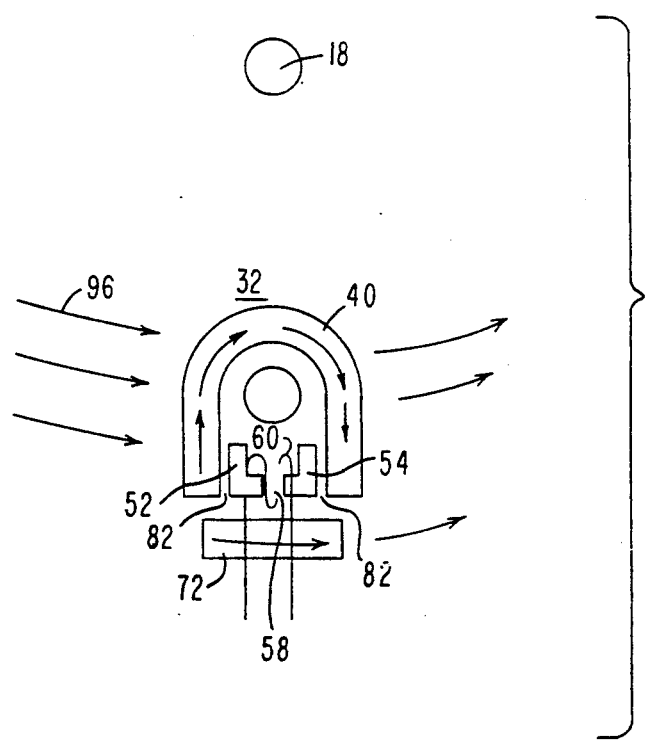

When the adjacent phase conductor such as 18 is located above or below the indicator 26-3 as shown in FIG. 5 the fluxes 96 pass horizontally through the indicator 26-3. The fluxes induced into the lamination 40 encounter three gaps, namely the two gaps 82 and the gap 58, in attempting to pass through the coil 60. However, they encounter little reluctance in, and preferentially pass through, the lamination 40 and the adjacent screen plate 72. This minimizes the flux passing through the coil 60.

Accordingly, the series gaps 58 and 82 and the parallel screen plate 72 substantially attenuate noise currents induced in the coil 60. At angles between the conductor 16 and 18 in FIGS. 3 and 4 the effects of both FIGS. 3 and 4 combine to minimize flux in the coils.

The invention prevents an adjacent live phase conductor with a sufficiently high current from falsely resetting open line indicators that have been tripped by a surge of current accompanying a short circuit fault and subsequent open circuit as the circuit breaker opens the line. Thus the invention provides an improved signal to "noise" ratio.

The air gap 58 represents a region of increased magnetic circuit reluctance in the center of the ferromagnetic core and within the center of the sensor coil 60. The air gap attenuates the signal level but slightly while furnishing a significantly large immunity against the influence of adjacent magnetic field "noise." The signal to noise ratio improves markedly so that one may use highly sensitive indicators to register low level signal currents upon restoration of power to an area. Such high sensitive indicators would have been susceptible to false resets in the past. Yet, rural areas, for example, require highly sensitive fault indicators because the networks deliver power at high voltages and consequently at low current to minimize $I^2R$ losses. If the fault indicator detects a fault, it trips the indicator to display the fault. Upon restoration of service, the indicator must possess sufficient sensitivity to restore indication to the reset no-fault condition.

The magnetic field drops with distance from the center of an adjacent phase conductor. As shown in FIG. 4, the field intensity, which strikes the coil 60 perpendicularly, almost equally divides at the central gap 58 to thread the right and left halves of the windings of the coil 60 in equal but opposite intensity of changing magnetic field. This phenomenon results from the interposition of the gap 58 such that a line of flux impinging on the right half of the split core "sees" but one gap 82 to complete its path if it goes to the right and two reluctances 58 and 82 in series if it goes to the left. Similarly, if a flux line of nearly equal intensity strikes to the left of the gap 58, it "sees" less reluctance by staying left than by jumping the gap 58 as well as the gap 82 on the right. In effect, the combination of the gap in the magnetic circuit and the common "handedness" of the single winding 60 produces an additive voltage in the output of the coil 60 for the phase being monitored, while creating a subtractive phenomenon in the coil 60 in response to "noise" from an adjacent power cable. This constitutes a "magnetic" common mode rejection which produces a very large capability of sensing intended signals only.

The plate 72 of high mu 80% Ni—Fe material or cold rolled steel forms a screen outside the coil. This plate shields the coil 60 from fluxes in a horizontal attitue as in FIG. 5 and to a lesser degree as the attitude rotates to that shown in FIG. 4. That is, in all attitudes of the fault indicator to adjacent fields the plate 72 shorts out the external fields which induce the flux line and causes the flux to bypass the sense coils. This effectively extends the range of adjacent signal intensity exclusion. The plate 72 forms a bypass. As the bypassed field intensity increases the flux density within the shield, the shield field has an orientation which resists rotation to the leakage to the coil core elements, and thus becomes more effective. Saturation reduces the permeability of the ferromagnetic material and flux lines from other sources cannot cause a field rotation unless the new field is substantially stronger than the initial field intensity.

While embodiments of the invention have been described in detail, it will be evident to those skilled in the art that the invention may be practiced otherwise without departing from its spirit.

What is claimed is:

1. A sensor for sensing current in a conductor, comprising:
   a coil;
   magnetic means passing through said coil for coupling said coil to said conductor;
   said magnetic means having a given magnetic reluctance and forming a portion within said coil with a magnetic reluctance higher than the given reluctance;
   said magnetic means including two laminar sections extending toward each other within said coil to fashion a magnetic gap having the higher reluctance, said laminar sections terminating at the gap in two projections transverse to the laminar sections and facing each other.

2. A sensor as in claim 1, wherein said magnetic means includes a collar for surrounding the conductor.

3. A sensor as in claim 1, wherein said second section within said coil includes a magnetic gap.

4. A sensor as in claim 2, wherein said second section within said coil includes a magnetic gap.

5. A sensor as in claim 1, wherein said portion within said coil is a gap substantially equal to an air gap.

6. A sensor as in claim 2, wherein said second section within said coil is a gap substantially equal to an air gap.

7. A sensor as in claim 1, wherein said magnetic means includes a U-shaped portion outside the coil.

8. A sensor as in claim 7, wherein said extensions portions form a magnetic gap between the extension portions so as to establish the section with the higher reluctance.

9. A sensor as in claim 7, wherein the magnetic gap is substantially equal to an air gap.

10. A sensor as in claim 1, wherein said magnetic means includes a section outside the coil and forming a magnetic plate.

11. A sensor as in claim 10, wherein said magnetic means includes a collar for surrounding the conductor.

12. A sensor as in claim 10, wherein said second section within said coil includes a magnetic gap.

13. A sensor as in claim 11, wherein said second section within said coil includes a magnetic gap.

14. A sensor as in claim 10, wherein said second section within said coil is a gap substantially equal to an air gap.

15. A sensor as in claim 11, wherein said second section within said coil is a gap substantially equal to an air gap.

16. A sensor as in claim 10, wherein said magnetic means includes a U-shaped portion outside the coil said plate being opposite the U-shaped portion.

17. A sensor as in claim 16, wherein said extensions portions form a magnetic gap between the extension portions so as to establish the section with the higher reluctance.

18. A sensor as in claim 16, wherein the magnetic gap is substantially equal to an air gap.

19. A sensor as in claim 1, wherein the coil has a length and is wound in one direction throughout its length.

20. A sensor as in claim 1, wherein the coil has a length and is wound in one direction throughout its length, and the second section of higher reluctance is in the center of the length of the coil.

21. A sensor as in claim 1, wherein:
   said magnetic means passing through said coil forms a path for flow of flux induced by the conductor; and
   said gap is in the path of the flux and reduces the flow of flux through said magnetic means.

22. A sensor as in claim 1, wherein:
   said magnetic means passing through said coil forms a path for flow of flux induced by the conductor;
   said gap is in the path of the flux and reduces the flow of flux through said magnetic means; and
   said gap extends across the flow of flux through said magnetic means.

23. A sensor as in claim 1, wherein:
   said magnetic means passing through said coil forms a path for flow of flux induced by the conductor;
   said gap is in the path of the flux and reduces the flow of flux through said magnetic means; and
   said gap is located axially central within said coil.

24. A sensor as in claim 1, wherein:
   said magnetic means has a linear direction, and said extends across the linear direction.

25. A sensor as in claim 1, wherein:
   desensitizing means limit sensitivity to magnetic fluxes from sources extraneous to fluxes from the conductor;
   said coil has an axis; and said desensitizing means includes said magnetic means with said gap for dividing fluxes transverse to the axis of said coil into paths away from said second section.

26. A sensor as in claim 1, wherein:
desensitizing means limit sensitivity to magnetic fluxes from sources extraneous to fluxes from the conductor;
said coil has an axis;
said desensitizing means includes said magnetic means and said second section for dividing fluxes transverse to said coil into paths away from said second section; and
said second section is located centrally along the axis of said coil.

27. A fault indicator, comprising:
a sensor;
an electronically driven fault and no-fault display for displaying whether the sensor senses a fault condition; said sensor including a coil;
said sensor including magnetic means passing through said coil for coupling said coil to said conductor;
said magnetic means having a given magnetic reluctance and forming a portion within said coil with a magnetic reluctance higher than the given reluctance;
said magnetic means including two laminar sections extending toward each other within said coil to fashion a magnetic gap having the higher reluctance, said laminar sections terminating at the gap in two projections transverse to the laminar sections and facing each other.

28. A fault indicator as in claim 27, wherein:
desensitizing means limit the sensitivity to magnetic fluxes from sources extraneous to fluxes from the conductor;
said coil has an axis; and
said desensitizing means includes said magnetic means with said second section for dividing fluxes transverse to the axis of said coil into paths away from said second section.

* * * * *